US007843087B2

(12) United States Patent
Ryoo et al.

(10) Patent No.: US 7,843,087 B2
(45) Date of Patent: Nov. 30, 2010

(54) PULSE POWER GENERATOR USING SEMICONDUCTOR SWITCH

(75) Inventors: Hong Je Ryoo, Changwon-si (KR); Jong Soo Kim, Changwon-si (KR); Geun Hie Rim, Changwon-si (KR); Guennadi Gussev, Changwon-si (KR)

(73) Assignee: Korea Electro Technology Research Institute, Gyeongsangnam-Do (KR)

( * ) Notice: Subject to any disclaimer, the term of this patent is extended or adjusted under 35 U.S.C. 154(b) by 642 days.

(21) Appl. No.: 11/801,953

(22) Filed: May 11, 2007

(65) Prior Publication Data
US 2008/0106151 A1    May 8, 2008

(30) Foreign Application Priority Data
Nov. 2, 2006    (KR) .................... 10-2006-0107571

(51) Int. Cl.
*H03K 3/00* (2006.01)
(52) U.S. Cl. ....................................... 307/108; 307/106
(58) Field of Classification Search ................ 307/113, 307/108, 110, 106; 363/132, 65; 327/438, 327/179
See application file for complete search history.

(56) References Cited
U.S. PATENT DOCUMENTS
4,442,471 A * 4/1984 Trayer .......................... 361/63

FOREIGN PATENT DOCUMENTS
JP        2001053596 A * 2/2001

OTHER PUBLICATIONS

Scott Castagno, A Cascade Boost Converter Design, Demonstration, and Scaling for Future High Voltage Power Conditoning Systems, University of Missouri—Columbia, May 2006.*
R. Cassel et al., Solid State Induction Modulator Replacement for SLAC Klystron Modulators, 24th International Power Modulator Symposium, Norfolk, VA, Jun. 2000.*
Castagno et al., Analysis and Comparison of a Fast Turn on Series IGBT Stack and High Voltage Rated Commercial IGBTs, Jun. 2005, Pulsed Power Conference 2005 IEEE, pp. 912-915.*
Kim et al., IGBT Stacks Based Pulse Power Generator for PIII&D, Pulsed Power Conference 2005 IEEE, pp. 1065-1068; (no month available) 2005.*
H.J. Ryoo et al. ; <<Development of 60kV Pulse Power Generator Based on IGBT Stacks for Wide Application >> :*IEEE*, 2006, pp. 511-514.

(Continued)

*Primary Examiner*—Jared J Fureman
*Assistant Examiner*—Daniel Cavallari
(74) *Attorney, Agent, or Firm*—Frommer Lawrence & Haug LLP; Ronald R. Santucci

(57) ABSTRACT

The present invention provides a pulse power generator using a semiconductor switch, which enables its lifespan to be significantly improved, allows for its miniaturization, and makes it possible to diversely control a high-voltage pulse output finally. According to the pulse power generator, it is possible to address and solve a difficulty in driving the semiconductor switch in series, i.e., the problems related to synchronization and insulation of a driving power supply, and to include a circuit which can cope with the generation of arc and short circuit to thereby significantly improve device protecting performance and stability of the pulse power generator.

26 Claims, 13 Drawing Sheets

OTHER PUBLICATIONS

Literature from "The Korean Institute of Electrical Engineers, Proceeding of the 37$^{th}$ the KIEE Summer Annual Conference 2006". 4 pages.

Literature from 2006 International Power Modulator Conference, 27$^{th}$ Power Modulator Symposium and 2006 High Voltage Workshop, May 14-18. 2006 Washington, D.C.; 2006 IPMC Abstracts. 4 pages.

Literature (Pocket Program) from 27$^{th}$ Power Modulator Symposium and 2006 High Voltage Workshop May 14-18, 2006, Washington, D.C. 61 pages.

* cited by examiner (a)

(b)

PULSE POWER GENERATOR USING SEMICONDUCTOR SWITCH

CROSS-REFERENCE TO RELATED APPLICATIONS

This application claims the benefit under 35 U.S.C. §119(a) of Korean Patent Application No. 10-2006-0107571, filed in the Korean Intellectual Property Office on Nov. 2, 2006, the entire contents of which are incorporated herein by reference.

BACKGROUND OF THE INVENTION (a) Field of the Invention

The present invention relates to a pulse power generator using a semiconductor switch, and more particularly to such a pulse power generator using a semiconductor switch, which enables its lifespan to be significantly improved, allows for its miniaturization, and makes it possible to diversely control a high-voltage pulse output finally.

(b) Background Art

In general, a high-voltage pulse generating circuit uses various test equipment and a plasma generator (PSII, etc.) as a load. A conventional high-voltage pulse generating circuit embraces lots of problems in terms of lifespan of the switch, variation in the pulse width, increase in the operating frequency, adjustment of the pulse voltage, need for a high-voltage DC power supply and the like.

For example, such a conventional pulse generating circuit is divided into a type employing a Marx generator using two-electrode spark gaps, a type employing a vacuum-tube switch and a type in which a low-voltage pulse is boosted to a high-voltage pulse simply using a pulse transformer. However, the type employing the spark gaps or the vacuum-tube switch encounters shortcomings in that its lifespan is short, the adjustment of a pulse width is not flexible and very difficult, there is a limitation in increasing a pulse repetition rate and a high-voltage DC power supply circuit is needed. Also, the type employing the pulse transformer entails demerits in that it is difficult to achieve an ultra fast rise time of a pulse due to the inductance of the transformer, the circuit is complicated since a reset circuit must be installed additionally due to the magnetic saturation of a transformer core, a noise is generated and an increase of the pulse width is difficult.

Now, the conventional prior art will be described hereinafter in detail with reference to the accompanying drawings.

FIG. 1 is a circuit diagram illustrating the construction of a Marx generator using spark gaps as disclosed in U.S. Pat. No. 4,900,947 issued to Maurice Weiner, Ocean, et al.

The Marx generator shown in FIG. 1 is a high-voltage pulse generator of a type which is most widely used in a high power field.

As well known in the art, it is required that a pulse generating circuit should be supplied with a DC power to allow capacitors to be charged in parallel and the capacitors should be connected with one another in series at a specific time point to discharge their voltage for application to a final output terminal thereby to generate and output a high-voltage pulse. Thus, as shown in FIG. 1, the Marx generator includes a plurality of capacitors and a plurality of spark gap switches. When DC power is applied to an input terminal of the Marx generator through the spar gap switches, the capacitors are charged in parallel and then are connected with one another in series to discharge their voltage by actuating the spark gap switches at a specific time point.

That is, the plurality of capacitors are connected to one another in parallel via resistors with respect to a high-voltage DC power to form a bank, and a spark gap switch is mounted between a positive (+) terminal of each capacitor and a negative (−) terminal of a next capacitor. When high-voltage DC power is applied to an input terminal of the Marx generator, the respective capacitors are charged in parallel via the resistors. Also, when the spark gap switches are turned on to be electrically conducted along with the discharging of the generator at a desired specific time point, the DC voltage charged in the respective capacitors is instantaneously discharged simultaneously. At this time, a final high-voltage DC power obtained by adding the DC voltages of the respective capacitors discharged in series is applied through a final output terminal.

However, it is necessarily required that a high-voltage DC power supply should be basically installed at an input terminal of the generator so as to operate the spark gap switches and a particular trigger circuit is needed to correctly adjust the time point when a pulse voltage is generated. Especially, the Marx generator has several demerits in that a maximum pulse repetition rate (pulse frequency) is restricted, the arbitrary adjustment of a pulse width is impossible, and the spark gap switches have a great limitation in terms of lifespan due to abrasion generated each time a spark occurs as being mechanical discharge switches. In addition, a short circuit occurs in a load, it is impossible to restrict a short circuit current. Further, the Marx generator has problems in that the smaller the number of stages being connected is, the higher the voltage each stage must endure becomes so that a withstanding voltage of each switch is raised, and in that when the withstanding voltage of each stage is alternatively lowered, the number of stages to be connected increases so as to obtain a necessary voltage.

Meanwhile, there have been attempts to utilize insulated gate bipolar transistors (hereinafter abbreviated as "IGBT") as semiconductor switches instead of the spark gap switches in the Marx pulse generator shown in FIG. 1. The GBT has a permanent lifespan. In case where the GBT is used, the disadvantages of the conventional Marx pulse generator are overcome so that, for example, a pulse repetition rate and a pulse width can be controlled. But such a conventional Marx generator still has a risk that its reliability may be deteriorated due to strict restraints on the driving of the switches simultaneously and even voltage distribution of switches. The higher the voltage is, the more the number of stages increases so that the size of the system also increases.

The most critical technology in the pulse generator using the IGBT as the semiconductor switch is to overcome the voltage rating and the current rating of the semiconductor switch. The IGBT has a low current rating and a low voltage rating unlike an existing gas discharge switch. A method may be employed in which one IGBT is not used instead of a single spark gap switch, but a plurality of IGBTs are be connected with one another in series as many as needed so as to be sufficient to withstand a voltage rating so that they are turned on/off concurrently. However, in this case, when the IGBTs are turned on or off, a unbalance of the voltage is prone to occur due to a difference in driving timing. At this time, any voltage higher than the voltage rating of IGBT may cause the IGBT to be damaged immediately. Actually, despite application of a completely synchronized gate signal, it is impossible to concurrently turn on/off the IGBTs due to the difference of internal parameters (for example, resistor value or inductance value) of individual elements. If the turning on/off of the IGBT is not synchronized, for example, if only one IGBT from multi connected IGBTs is not synchronized with others to cause turned off earlier, the entire voltage is applied across the IGBT which is not synchronized to cause the IGBT to be damaged, which results in sequential breakages of the remaining IGBTs due to the damage of the specific IGBT. Moreover, when the IGBTs are driven in series, each switch needs an independent gate power supply. In this case, as it goes toward an upper portion in a series-switch arrangement, the dielectric strength of the independent gate power supply must increase. Thus, in a high-voltage driving, one of the most difficult technologies is known as high voltage insulation of the gate power supply.

As another example of a technology employing the IGBT in the art, in FIG. 2, there is shown a power modulator as disclosed in U.S. Pat. No. 5,905,646 issued to Walter Frederick John Crewson, et al. The power modulator employs the IGBTs and transistors (hereinafter abbreviated as "TR"), in which voltage of a primary winding of a transformer is amplified through the transformer.

In the meantime, both the aforementioned Marx pulse generator and the power modulator using the IGBTs and the TRs as shown in FIG. 2 employ a high-voltage charger to which an SCR control method is applied. A conventional high-voltage charger, which has been used so far, entails a problem in that its entire size is greatly large. Therefore, there is a need for an improved high-voltage charger.

A gate power generator adopts a high-voltage insulation (double insulation) method, and an optical signal using an optical driving gate circuit may be used as a gate signal. The gate power generator, which has been developed so far, is very complicated in a structure for achieving a high-voltage insulation since it is subjected to a multi-staged voltage transformation for the sake of the high-voltage insulation. In addition, the gate power and the gate signal are generated by means of a separate construction, respective, which leads to a complexity of the entire construction. There is therefore a need for an improvement associated with the generation of the gate power and the gate signal.

Besides the problems which have been known so far in regard to the Marx pulse generator of FIG. 1 and the power modulator of FIG. 2, there are additional problems in that the two types have a limitation in a pulse width (<10 μs). Particularly, the generator of the type employing the TRs has a great restriction in a pulse rise/fall time due to a leakage inductance. Also, the generator embraces a problem in that the overall size of the apparatus is large and its operating efficiency is low. In addition, the generator of the type employing the IGBTs and the TRs enables protection of generation of arcs, but is problematic in that circuits are complicated.

SUMMARY OF THE INVENTION

Accordingly, the present invention has been made in an effort to solve the aforementioned problems occurring in the prior art, and it is an object of the present invention to provide a pulse power generator using a semiconductor switch, which solves problems associated with synchronization even while utilizing the semiconductor switch having a permanent lifespan to thereby improve the lifespan of the generator and its elements, enable its miniaturization and make it possible to diversely control a high-voltage pulse output finally.

Particularly, another object of the present invention is to provide a pulse power generator using a semiconductor switch, which addresses and solves a difficulty in driving the semiconductor switch in series, i.e., the problems related to synchronization and insulation of a driving power supply, and includes a circuit which can cope with the generation of arc and short circuit to thereby significantly improve element protecting performance and stability of the pulse power generator.

To accomplish the above object, in one aspect, the present invention provides a pulse power generator comprising:

a plurality of power stages connected in series with one another, each power stage including a plurality of power cells connected in series with one another, wherein each power cell has a semiconductor switch and a charge capacitor, an emitter of the semiconductor switch being connected to the charge capacitor, a power switch driver for driving the semiconductor switch, a bypass diode connected to both ends of the semiconductor switch, and a rectifying diode connected to both ends of the charge capacitor, and the semiconductor switches of the plurality of power cells are connected in series with one another;

a power inverter for supplying power so as to charge the charge capacitor;

a power loop for allowing the power to be supplied to the rectifying diodes within the respective power cells of each power stage from the power inverter, the power loop being formed of a high-voltage insulating cable;

a control inverter for supplying a control signal so as to generate a gate signal and a gate power of the semiconductor switch; and a control loop for allowing the control signal to be supplied to the power switch drivers within the respective power cells of each power stage from the control inverter, the control loop being formed of a high-voltage insulating cable, whereby the plurality of power stages are connected in series with one another so that the entire semiconductor switches are connected in series with one another.

BRIEF DESCRIPTION OF THE DRAWINGS

The above and other objects, features and advantages of the present invention will be apparent from the following detailed description of the preferred embodiments of the invention in conjunction with the accompanying drawings, in which.

Figure 1:
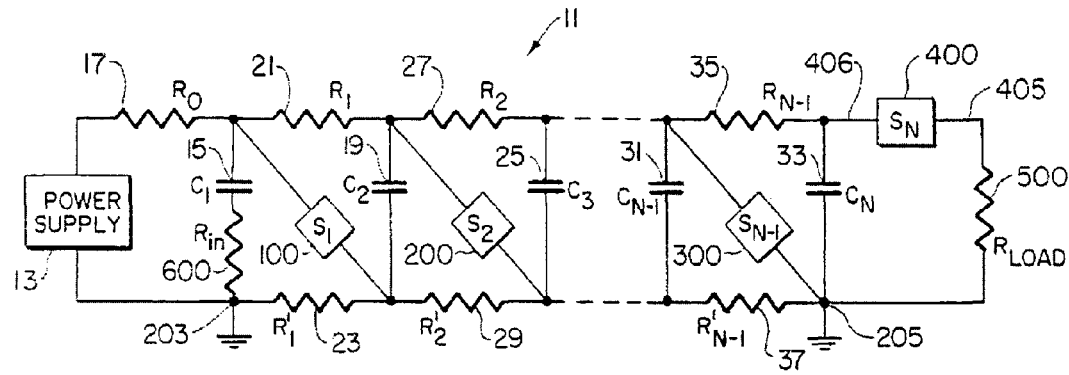
FIG. 1 is a circuit diagram illustrating the construction of a conventional Marx generator using spark gaps according to the prior art.
Figure 2:
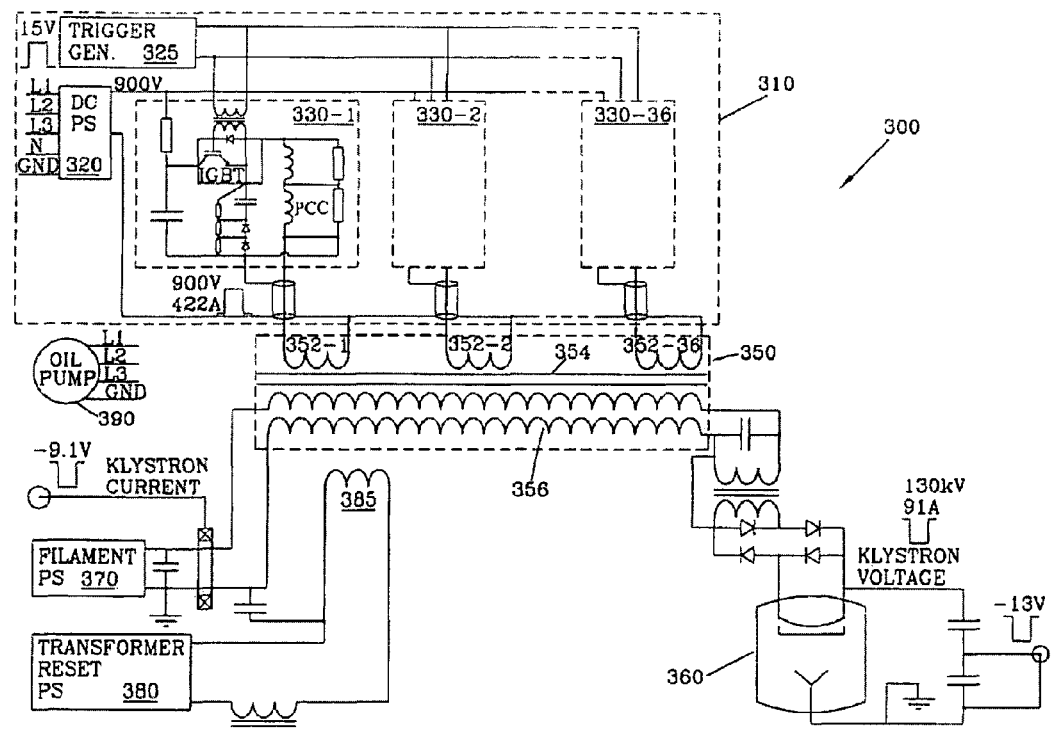
FIG. 2 is a circuit diagram illustrating the construction of a conventional power modulator using a transformer and a semiconductor device.

Reference numerals set forth in the Drawings includes reference to the following elements as further discussed below:

| 100: | pulse power generator | 110: | power stage |
| 111: | power cell | 112: | semiconductor switch |
| 113: | charge capacitor | 116: | power switch driver |
| 117: | semiconductor switch module | 118: | storage capacitor |
| 119: | heat sink | 120: | power inverter |
| 130: | power loop | 131: | power transformer |
| 132: | compensation winding | 140: | control inverter |
| 150: | control loop | 151: | control transformer |

DETAILED DESCRIPTION

Reference will now be made in detail to the preferred embodiment of the present invention, examples of which are illustrated in the drawings attached hereinafter, wherein like reference numerals refer to like elements throughout. The embodiments are described below so as to explain the present invention by referring to the figures.

A pulse power generator according to the present invention has been configured from the point of view that all the semiconductor switches are connected in series with one another such that if voltage applied to each semiconductor switch is lowered to a voltage level which one semiconductor switch can withstand, a serious problem can be overcome in that the semiconductor switches are damaged sequentially like a chain reaction in case where the gate signals are not synchronized.

Figure 3:
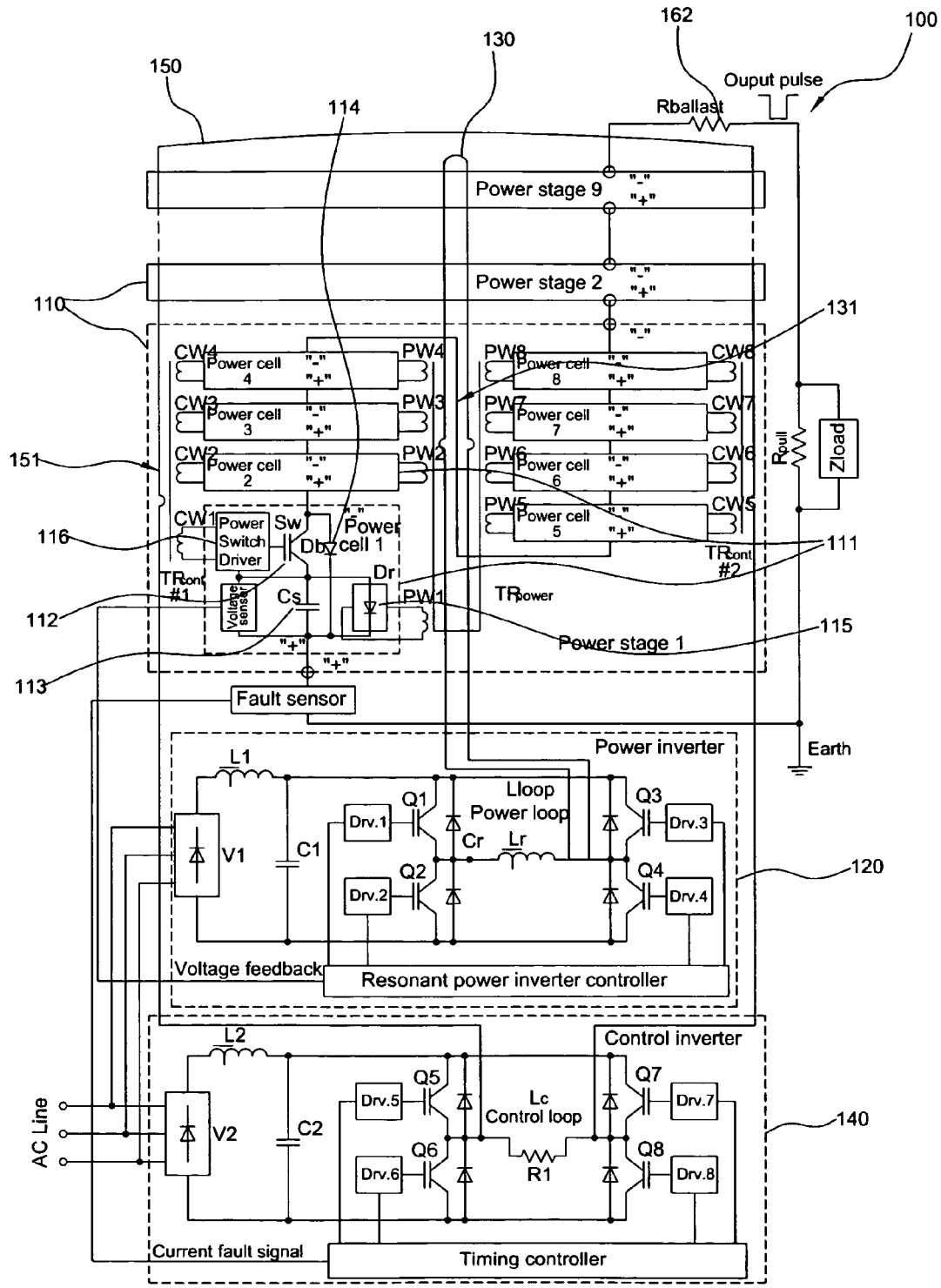
FIG. 3 is a circuit diagram illustrating the construction of a pulse power generator using a semiconductor according to the present invention.

FIG. 3 is a circuit diagram illustrating the construction of a pulse power generator using a semiconductor according to the present invention.

As shown in FIG. 3, the pulse power generator 100 of the present invention comprises: a plurality of power stages 110 each including a plurality of power cells 111 connected in series with one another, each power cell having a semiconductor switch 112 and a charge capacitor 113; a power inverter 120 for supplying power so as to charge the charge capacitor; a power loop 130 connected in such a fashion as to allow the power to be supplied between the respective power cells 111 from the power inverter 120, the power loop being formed of a high-voltage insulating cable; a control inverter 140 for supplying a control signal so as to generate a gate signal and a gate power of the semiconductor switch 112; and a control loop 150 for connected in such a fashion as to allow the control signal to be supplied between the respective power cells 111 from the control inverter 140, the control loop being formed of a high-voltage insulating cable.

Now, each constituent element of the pulse power generator 100 will be described hereinafter in detail.

First, the pulse power generator 100 of the present invention comprises a plurality of power stages 110 entirely connected with one another in series, which are disposed in a vertical direction in FIG. 3. In this case, each power stage 110 is composed of a plurality of power cells 111 connected with one another in series. Each of the power cells 111 constituting each power stage 110 includes a semiconductor switch 112, for example an IGBT and a charge capacitor 113. An emitter of the semiconductor switch is configured to be connected to the charge capacitor. In each power stage 110 in which a plurality of power cells 111 are connected with one another in series, all of the semiconductor switches 112 and the charge capacitors 113 are connected with another in series within the power cells. In this manner, the pulse power generator 100 of the present invention allows the semiconductor switches 112 and the charge capacitors 113 of the respective power cells 111 to be all connected with one another in series to form a single power stage 110. Further, the inventive pulse power generator 100 is configured such that the semiconductor switches 112 and the charge capacitors 113 of the respective power cells 111 in the plurality of power stages 110 are all connected with one another in series.

Referring to FIG. 3, the plurality of power stages 110 are all connected with one another in series while a single power stage 110 including a plurality of power cells 111 connected with one another in series. In this case, the entire semiconductor switches and charge capacitors are connected with one another in series. The power cells 111 connected with one another in series in each power stage 110 have identical configurations. In FIG. 3, only the constructional circuit of a power cell 1 has been shown.

As shown in FIG. 3, each power cell 111, which is a main switch, includes a semiconductor switch 112, a charge capacitor 113 connected in series with the semiconductor switch 112, a bypass diode 114 connected to both ends of the semiconductor switch 112, a rectifying diode 115 connected to both ends of the charge capacitor 113, and a power switch driver (gate driving circuit) 116 for receiving an insulated gate power (i.e., a control signal applied from the control inverter 140) from the control loop 150 having one turn so as to supply a gate signal and a driving power to the semiconductor switch 112 to drive the semiconductor switch 112.

Here, the semiconductor switch may be an IGBT or a MOSFET.

The bypass diode 114 allows current to flow through other power cells 111 when a semiconductor switch 112 of a power cell 111 is opened. The bypass diode 114 functions as a snubber diode for preventing sparks generated between the semiconductor switches 112. Thus, a separate damping element is not needed, and it is possible to address and solve a problem associated with the synchronization of the semiconductor switch through a bypass path.

Further, the rectifying diode 115 is connected to windings PW1 to PW8 of the power transformer 131 and employs a full bridge rectifier diode.

The power switch driver 116 within each power cell 111 is configured such that it is connected to a gate, a collector and an emitter of a semiconductor switch 112 within a corresponding power cell 111 and receives the control signal supplied from the control inverter 140 through a control transformer 151 composed of the control loop 150 and the windings CW1 to CW8 so as to concurrently output the gate signal and the driving power for driving the semiconductor switch 112 in response to the received control signal. That is, the power switch driver 116 receives the control signal (supplied for a insulated gate power to drive the semiconductor switch) of the control inverter 140 from a primary winding of the control transformer 151, i.e., the control loop 150 having one turn through secondary windings CW1 to CW8 so as to concurrently supply the gate signal and the gate power (driving power) to the semiconductor switch 112. Particularly, as will be described later, the power switch driver 116 is configured such that the semiconductor switches 112 within the power stages 110 are turned on/off concurrently so that a pulse width can be adjusted in response to the control signal applied through the control transformer 151, i.e., a turn-on signal and a turn-off signal.

Figure 5:
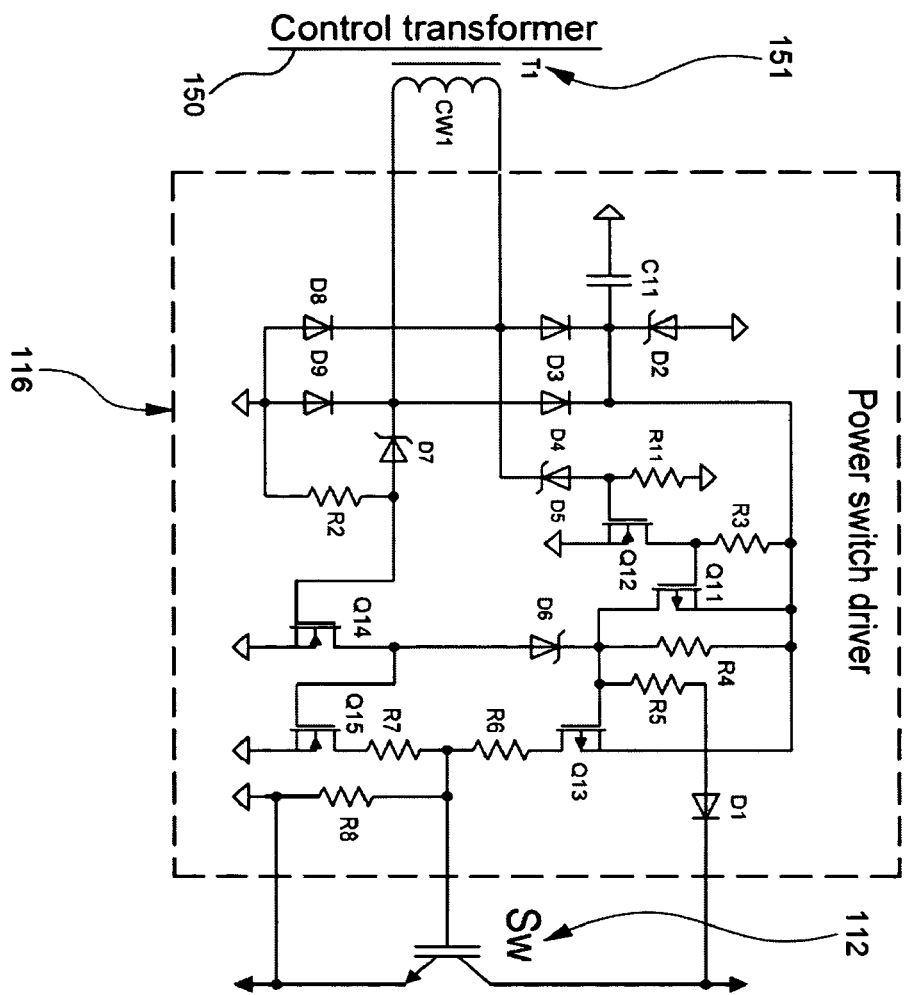
FIG. 5 is a circuit diagram illustrating a power switch driver according to the present invention.
Figure 5:
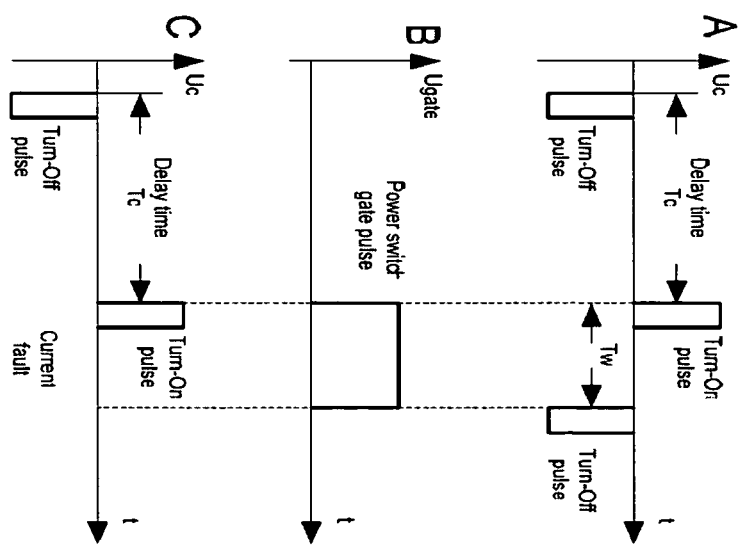

The circuit construction and principle of the power switch driver (gate driving circuit) 116 is shown in FIG. 5. As shown in FIG. 5, the power switch driver 116 of each power cell 111 is configured to receive the control signal (insulated gate power) applied form the control inverter 140 through the control transformer 151 whose primary winding has one turn. When the power switch driver 116 receives the control signal, it concurrently outputs the gate signal and the driving power (gate power) for driving the semiconductor switch 112.

The construction of the power switch driver 116 will now be described hereinafter in detail.

As shown in FIG. 5, the power switch driver 116 includes:

a capacitor C11 adapted to be charged in response to a turn-on signal and a turn-off signal of the control inverter 140 applied through the control transformer (control loop) 151 and to supply the charged power as a driving power to the collector of the semiconductor switch 112;

a switching transistor Q13 connected to a gate of the semiconductor switch 112 to be turned on in response to the turn-on signal of the control inverter 140 applied through the control transformer 151 so as to apply the gate signal to the semiconductor switch 112 to turn on the semiconductor switch 112; and a plurality of diodes D1 to D9, switching transistors Q11, Q12, Q14 and Q15, and resistors R11 to R8, which are disposed between the capacitor C11 and the switching transistor Q13, and between the switching transistor Q13 and connection terminals connected to the gate, the collector and the emitter of the semiconductor switch 112, so that when the turn-on signal is applied to the power switch driver 116 through the control loop 150, the switching transistor Q13 is turned on and simultaneously power charged in the capacitor C11 is applied to the collector of the semiconductor switch 112, and when the turn-off signal is applied to the power switch driver 116 through the control loop 150 or when a short circuit occurs at both ends of the semiconductor switch 112, the switching transistor Q13 is turned off to turn off the semiconductor switch 112.

As shown in FIG. 5, the power switch driver is driven by means of the control signal supplied from the control inverter 140, i.e., a turn-on signal having a positive (+) polarity and a turn-off signal having a negative (−) polarity. In this case, the turn-on signal and the turn-off signal are applied to the power switch driver through the control transformer 151.

In the power switch driver of the present invention, the respective turn-on and turn-off signals are applied from the control inverter 140 through the control transformer 151 and simultaneously allows the capacitor C11 to be charged to supply the driving power to the semiconductor switch 112 via a diode D4, and hence the capacitor C11 functions as an insulated power source.

The power switch driver shown in FIG. 5 is constructed such that the driving power is charged in the capacitor C11 by means of the control signal applied thereto through the control transformer 151.

Figure 6:
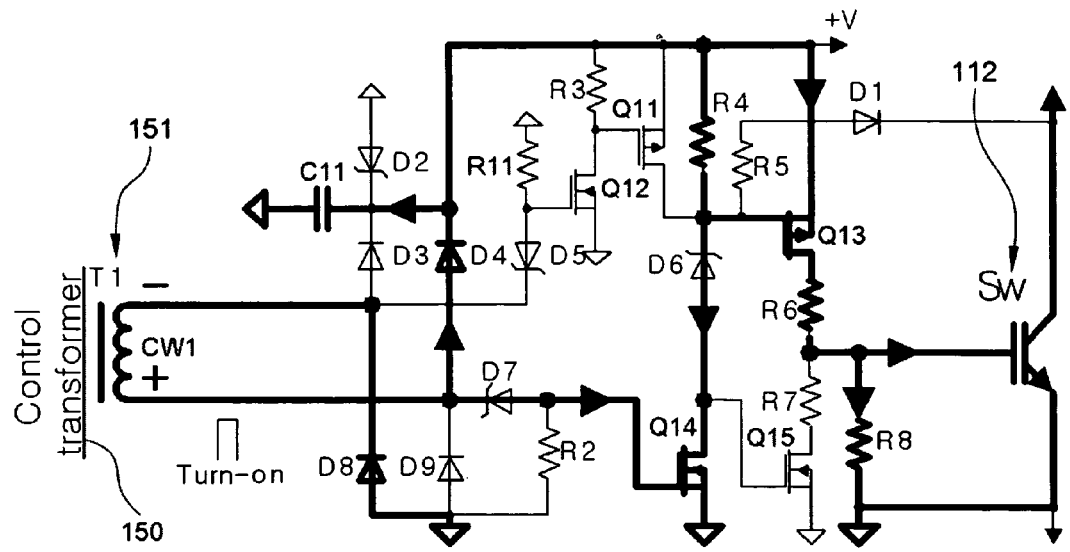
FIGS. 6 to 8 are circuit diagrams illustrating the respective operation modes of the power switch driver according to the present invention.

Each cycle of operation, as shown in FIG. 5, starts with the application of turn-off signal (turn-off pulse) to pre-charge the capacitor C11. Referring to FIG. 6, when the turn-on signal (turn-on pulse) is applied to the power switch driver after the lapse of a delay time Td (for example, 100 μs), the switching transistor Q13 connected to the semiconductor switch 112 is turned on. At this time, a positive voltage is applied to the gate of the semiconductor switch 112 to cause the semiconductor switch 112 to be turned on and simultaneously the driving power charged in the capacitor C11 is applied to the collector of the semiconductor switch 112.

Figure 7:
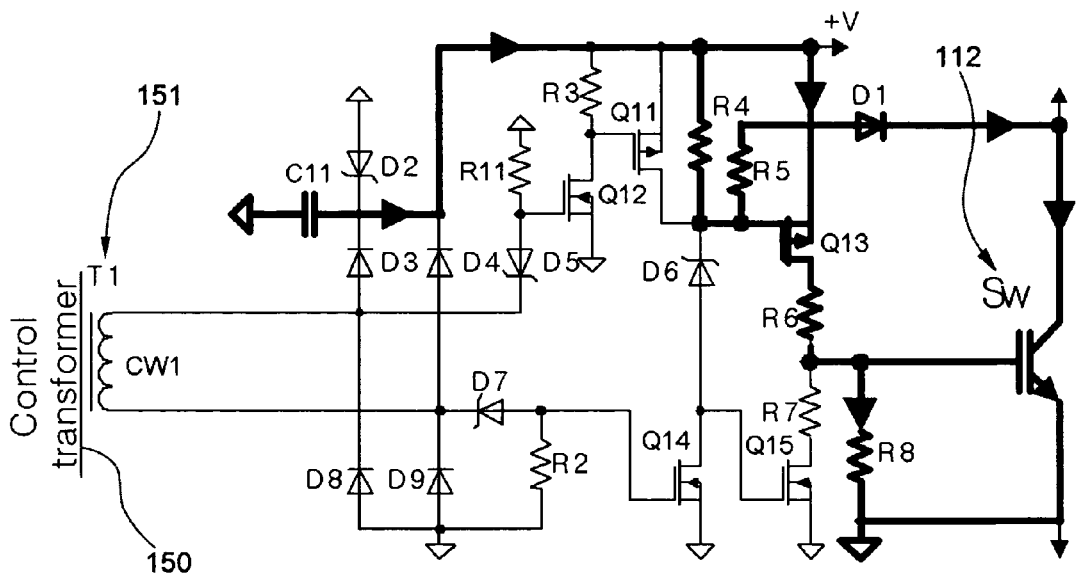

Referring to FIG. 7, although the turn-on signal is extinguished after the semiconductor switch 112 is turned on, the switching transistor Q13 continues to be maintained in a turned-on state until the turn-off signal is applied to the power switch driver. This is because after the switching transistor Q13 is turned on to supply the gate voltage to the semiconductor switch 112, the semiconductor switch 112 is turned on and then a gate terminal of the switching transistor Q13 is connected to a ground GND via the resistor R5, the diode D1 and the semiconductor switch 112 so as to continue to be maintained in the turned-on state.

Then, after the turn-on signal is applied to the power switch driver and then a delay time Tw elapses, when the turn-off signal is applied to the power switch driver, the power switch driver is inactivated. At this time, the semiconductor switch 112 is also turned off. Resultantly, when the turn-on signal is applied to the power switch driver, the semiconductor switch 112 is turned on, and when the turn-off signal is applied to the power switch driver, the semiconductor switch 112 is turned off, so that the turn-on/off time point of the semiconductor switch 112 can be freely controlled through the control of the turn-on signal and the turn-off signal. Thus, it is of course possible to freely adjust a pulse repetition rate and control the turn-on time of the semiconductor switch 112 so as to freely adjust the pulse width (the pulse width is maintained until the turn-off signal is applied to the power switch driver after application of a turn-on signal).

However, in case where a short circuit or arc occurs, current and voltage between the collector and the emitter of the semiconductor switch 112 abruptly increases, resulting in interruption of the gate circuit. Consequently, the semiconductor switch 112 is opened to accordingly protect the elements. In this manner, the reliability of the pulse power generator 100 can be ensured since immediate management on occurrence of arc or short circuit is possible.

Although the semiconductor switch 112 is turned on and simultaneously the turn-on signal applied thereto is extinguished, it is maintained in a turn-on state. Thereafter, when the turn-off signal is applied to the power switch driver 116, the power switch driver 116 is inactivated and the semiconductor switch 112 is also turned off.

Figure 8:
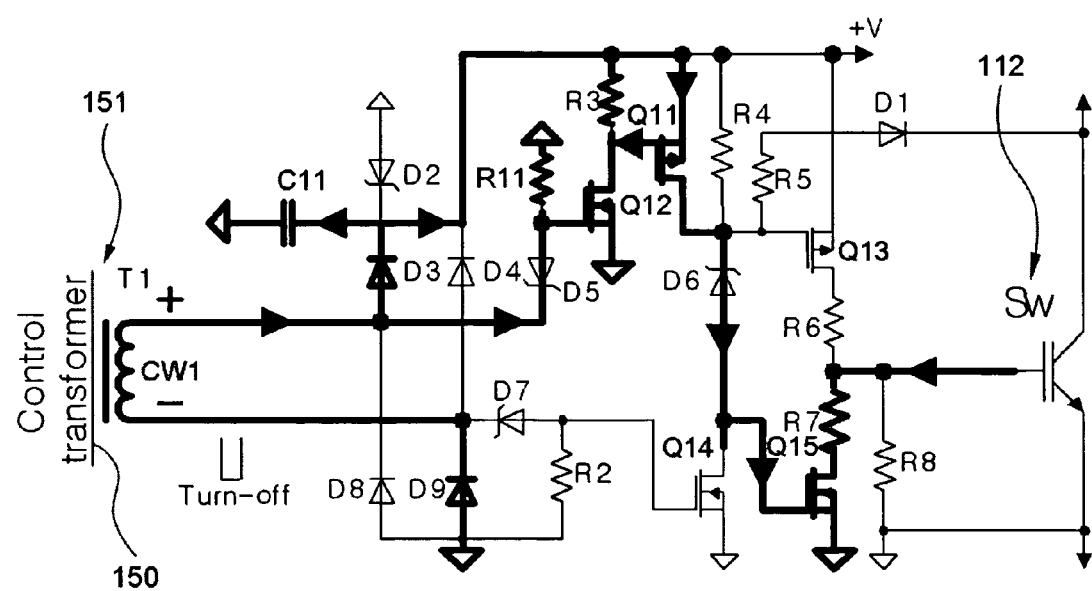

FIGS. 6 to 8 are detailed circuit diagrams illustrating the operation principle of the power switch driver according to the present invention.

Now, the operation states of the aforementioned power switch driver will be described hereinafter in more detail by each operation mode with reference to FIGS. 6 to 8.

Pre-Charging Mode

As shown in FIG. 8, a pre-charging routine is performed in which a turn-off pulse is applied to the power switch driver through the control loop 150 so as to charge only the voltage of the capacitor C11 corresponding to a gate power source while the semiconductor switch 112 is maintained in a turn-off state for the sake of safe operation. At this time, the flow of current is as shown in FIG. 8.

Turn-on pulse application mode

When the turn-on pulse is applied to the power switch driver in a state where the capacitor C11 is fully charged, as shown in FIG. 6, a pulse having a positive (+) polarity is applied to an lower end of the control transformer to cause the capacitor C11 to be charged via the diode D4 and zener diode D7 to be electrically conducted so as to turn on a switching transistor Q14. As the switching transistor Q14 is turned on, voltage of the capacitor C11 is supplied to the GND via the resistor R4 and the diode D6. Thus, voltage applied across the resistor R4 allows the switching transistor Q13 to be turned on. Similarly, the gate power charged in the capacitor C11 allows current to flow through the GND via the switching transistor Q13 and the resistors R6 and R8. Finally, voltage applied across the resistor R8 causes the semiconductor switch 112 to be turned on, and hence the semiconductor switch 112 is maintained in a turn-on state.

Turn-on Maintaining Mode

Once the switching transistor Q13 is electrically conducted and the semiconductor switch 112 is turned on, a conductive resistor between a drain and a source of the semiconductor switch 112 has a very small value. Although the turn-on pulse is extinguished, the gate power source allows a path to be formed to the GND via the resistors R4 and R5, the diode D1, and the semiconductor switch 112 as shown in FIG. 7, so that switching transistor Q13 continues to be electrically conducted. Therefore, in a normal situation, the semiconductor switch 112 is maintained in a turn-on state until the turn-off pulse is applied to the power switch driver by means of voltage applied across the resistor R8.

However, if an abnormal situation such as arc occurs at any load terminals causing short current, although the internal resistance of the semiconductor switch 112 has a small value, a voltage drop across the semiconductor switch 112 increases due to high short current to cause the diode D1 to be reverse-biased to thereby turn off the switching transistor Q13. Resultantly, the semiconductor switch 112 is turned off so as to protect the device from the short current.

Turn Off Mode

When the turn-off pulse is applied to the power switch driver through the control loop 150 during the turn-on maintaining period, a pulse having a positive (+) polarity is applied to an upper end of a secondary winding of the control transformer 151 to allow the capacitor C11 to be charged continuously while allowing current to flow through the GND via the diode D5 and the resistor R11 to thereby turn the switching transistor Q12. Therefore, the switching transistor Q11 and Q15 are sequentially turned on to cause a gate terminal of the semiconductor switch to be pulled-down to the GND, so that the semiconductor switch and the switching transistor Q13 are sequentially turned off to cause semiconductor switch to be maintained in an turn-off state until a next turn-on pulse is applied to the power switch driver.

In this manner, according to the power switch driver, the control of the application time between the turn-on pulse and the turn-off pulse enables free adjustment of the pulse width.

Each constituent element of a power cell has been described as above. In an embodiment of FIG. 3, eight power cells 111 are connected in series with one another to obtain a pulse output of 60 kV to thereby complete a single power stage 110 and nine power stages 110 are connected in series with one another. In this embodiment, the pulse power generator is designed such that 72 high-speed IGBTs 112 of 1200V/200A are used as the semiconductor switch 112 (since the number of power stages each consisting of eight power cells is 9), and one power stage 110 includes a total of eight power cells 111 to obtain an output power of 6.4 kV, 200A. Resultantly, when the semiconductor switches 112, i.e., the IGBTs within each power stage 110 are turned on concurrently, a pulse voltage of 6.8 kV is output from each power stage 110 and hence a total pulse voltage output from nine power stages 110 connected in series with one another is (6.8 kV×9), which will be output to a final output terminal. Of course, the number of power stages 110 and the number of power cells constituting each power stage 110 may be suitably modified in design depending on the need.

Meanwhile, the power cells 111 of each power stage 110 are supplied with power for charging the charge capacitor 113 through the power loop 130 connected to the power inverter 120 and are supplied with the control signal through the control loop 150 connected to the control inverter 140. The power stages 110 and the power cells constituting the power stages 110 are connected in parallel with one another, respectively, in association with the power supplied through the power loop 130 and the control loop 150. That is, it can be seen from FIG. 3 that the entire power stages 110 within the pulse power generator are connected in parallel with one another by means of the power loop 130 and the control loop 150.

Each power stage 110 includes the power and control transformers 131 and 151 that the power loop 130 and the control loop 150 constitute, respectively. Within each power stage 110, a primary winding of the power loop 130 and secondary windings PW1 to PW8 connected to the rectifying diodes 115 of the power cells 111 constitute the power transformer 131, and a primary winding of the control loop 150 and secondary windings CW1 to CW8 connected to the power switch drivers 116 of the power cells 111 constitute the control transformer 151. Thus, when the power inverter 120 supplies a high-voltage DC power to the pulse power generator 100 through the power loop 130, voltage transformed by the power transformer 131 is supplied to each power cell 111 to be charged in the charge capacitor 113, and a control signal supplied to the pulse power generator from the control inverter 140 through the control loop 150 is applied to the power switch driver 116 configured as the power switch driver through the control transformer 151 so as to output a gate signal and a driving power for driving the semiconductor switch 112.

In the pulse power generator 100 of the present invention, the power loop 130 and the control loop 150 for supplying the power and the control signal used to charge the capacitor 113 and to drive the semiconductor switch 112, respectively, employ one turn winding as the primary winding of the power and control transformer 131 and 151 so that the entire size and weight of the pulse power generator can be greatly reduced. Namely, the power loop 130 and the control loop 150 having the primary winding of one turn are used. The power loop 130 allows the secondary windings PW1 to PW8 (windings connected to the rectifying diodes 115 of the power cells 111) of the power cells 111 constituting each power stage within each power stage 110 to have one turn to thereby constitute the power transformer 131, and the secondary windings CW1 to CW8 (windings connected to the power switch drivers 116 of the power cells 111) of the power cells 111 constituting each power stage within each power stage 110 to have one turn to thereby constitute the control transformer 151.

The power loop 130 is formed of a high-voltage insulating cable (approximately 2.6 µH in inductance) having an insulation distance sufficiently spaced apart from an internal winding and ensuring an insulation level of 150 kV. The number of turns of the secondary windings PW1 to PW8 can be appropriately selected so as to be matched to the impedance of the power inverter 120 supplied to the pulse power generator through the power loop 130 and to prevent core saturation of the transformer.

The control loop 150 is also formed of a high-voltage insulating cable (approximately 40 in inductance), and the primary winding of one turn is constructed in the form of passing through the center of a core of the control transformer 151 on which the secondary windings CW1 to CW8 are wound. At this time, the control loop 150 is smaller in diameter than the power loop 130.

Referring to FIG. 3, one power transformer 131 and two control transformers 151 are included in each power stage 110. In this case, the power transformer 131 includes separated secondary windings PW1 to PW8 at the center side of the drawing so as to equalize a leakage inductance. It can be seen from FIG. 3 that the respective windings PW1 to PW8 are connected to the rectifying diodes 115 of respective power cells 111.

In each power stage 11, eight power cells 111 are connected to the power transformer 131 so that power applied to the pulse power generator through the power transformer 131 is charged in the eight capacitors 113. Also, in order to produce the gate signal and the gate power of the semiconductor switch 112 in each power cell 111 within each power stage 110, four secondary windings CW1 to CW8 of the control loop 150 separated from the primary winding of one turn are arranged on both sides of the drawing, respectively, to thereby constitute two control transformers 151. In this case, the separated respective secondary windings CW1 to CW8 are correspondingly connected to the power switch drivers 116 of the respective power cells 111.

In the meantime, the power inverter 120, which is a high-voltage charger adopting a series-resonant inverter type, is an constituting section that converts AC voltage applied thereto from an AC power supply into DC voltage so as to supply power for charging the charge capacitors to the power cells of each power stage 110 through the power loop 130.

The charge capacitors 113 of the power cells 111 are supplied with the DC voltage from the power inverter 120 via the power transformer 131 and are charged. Energy charged in the capacitors 113 is controlled by a variation in the operating frequency of the power inverter 120. The series-resonant inverter for charging the capacitors, as shown in FIG. 3, includes four switching transistor Q1 to Q4 and four diodes which are driven by means of a resonant power inverter controller via a full bridge inverter connected to the AC power supply, a resonant capacitor Cr, a resonant inductor Lr, the resonant power inverter controller and drivers (Drv.1-Drv.4). In addition, the resonant power inverter controller is intended to be fedback with a voltage value from a voltage sensor connected to both ends of the charge capacitor 113 of each power cell 111. This power inverter can be designed such that, for example, it has a resonant frequency of 100 kHz, an inverter driving frequency of 50 kHz at maximum and a maximum output power of 10 kW.

Figure 4:
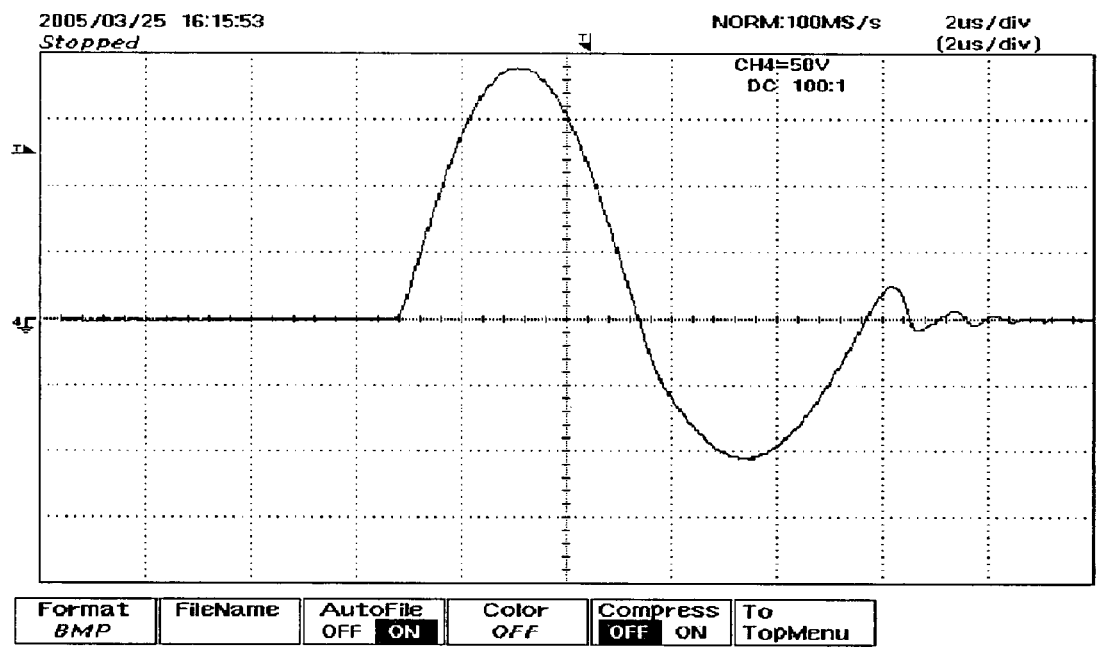
FIG. 4 is a waveform diagram of a charge current generated by a series-resonant inverter according to the present invention.

FIG. 4 is a waveform diagram of a charge current generated by a series-resonant inverter according to the present invention, which shows a current waveform measured actually during the operation of the high-voltage charger.

The control inverter 140 is a constituting section that converts AC voltage applied thereto from the AC power supply into DC voltage so as to supply a control signal to the power switch driver 116 through the control loop 150 for generating a gate signal and a gate power of the semiconductor switch within each power cell.

The control inverter 140 repeatedly supplies a turn-on signal and a turn-off signal as shown in "A" of FIG. 5 to the power switch driver 116 of the power cell 111 via the power loop (of the power transformer) 130. The control inverter 140 is configured in a similar manner to that of the power inverter 120. As shown in FIG. 3, the control inverter 140 includes four switching transistor Q5 to Q8 and four diodes which are driven by means of a timing controller via a full bridge inverter connected to the AC power supply, the timing controller and drivers (Drv.5 to Drv.8) for generating the turn-on signal and the turn-off signal.

In this case, the control inverter 140 generates the control signal under the driving control of the timing controller. A fault sensor installed at a ground terminal of the pulse power generator 100 is connected to the timing controller so that the timing controller can receive a current fault signal. Thus, the control inverter 140 is configured such that when overcurrent is generated therefrom, the timing controller determines generation of the overcurrent based on the current fault signal from the fault sensor to cause the operation thereof to be stopped.

Figure 9:
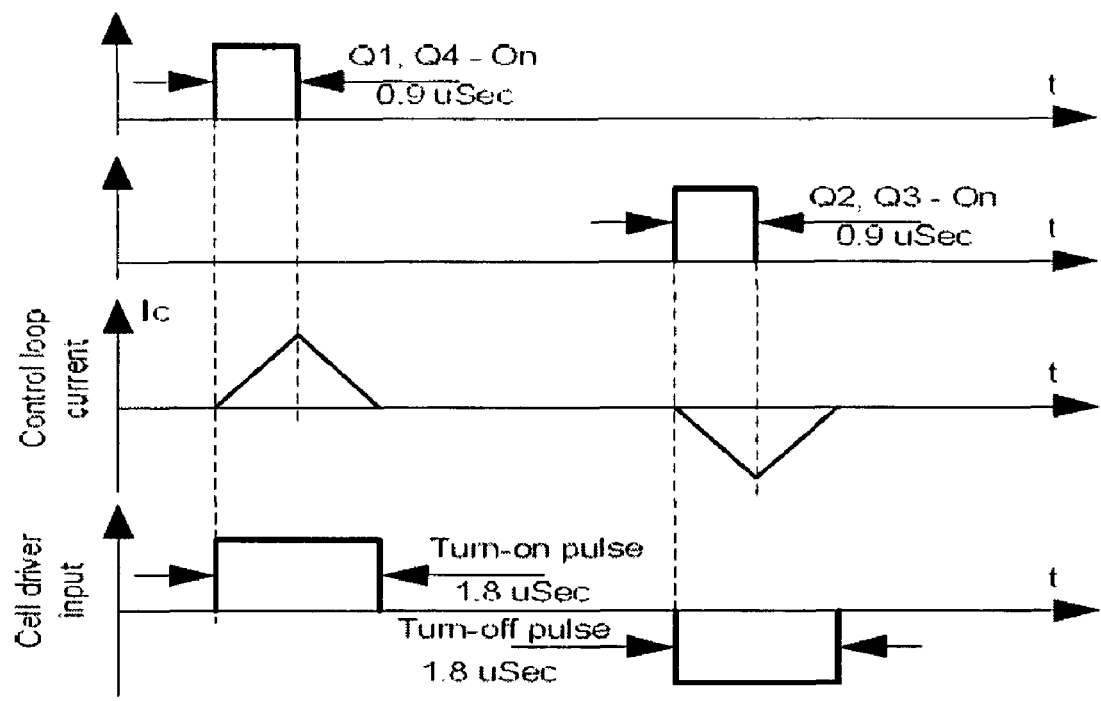
FIG. 9 is a timing chart illustrating a gate pulse adjustable by a control inverter according to the present invention.

FIG. 9 is a timing chart illustrating a gate pulse adjustable by a control inverter according to the present invention.

Referring to FIG. 9, it can be seen that the flow of current through the control loop 150 is formed in a triangular shape. A positive (+) turn-on pulse determines the rising edge of the gate pulse of the semiconductor switch 112, and a negative (−) turn-off pulse determines the falling edge of the gate pulse of the semiconductor switch 112.

Figure 10:
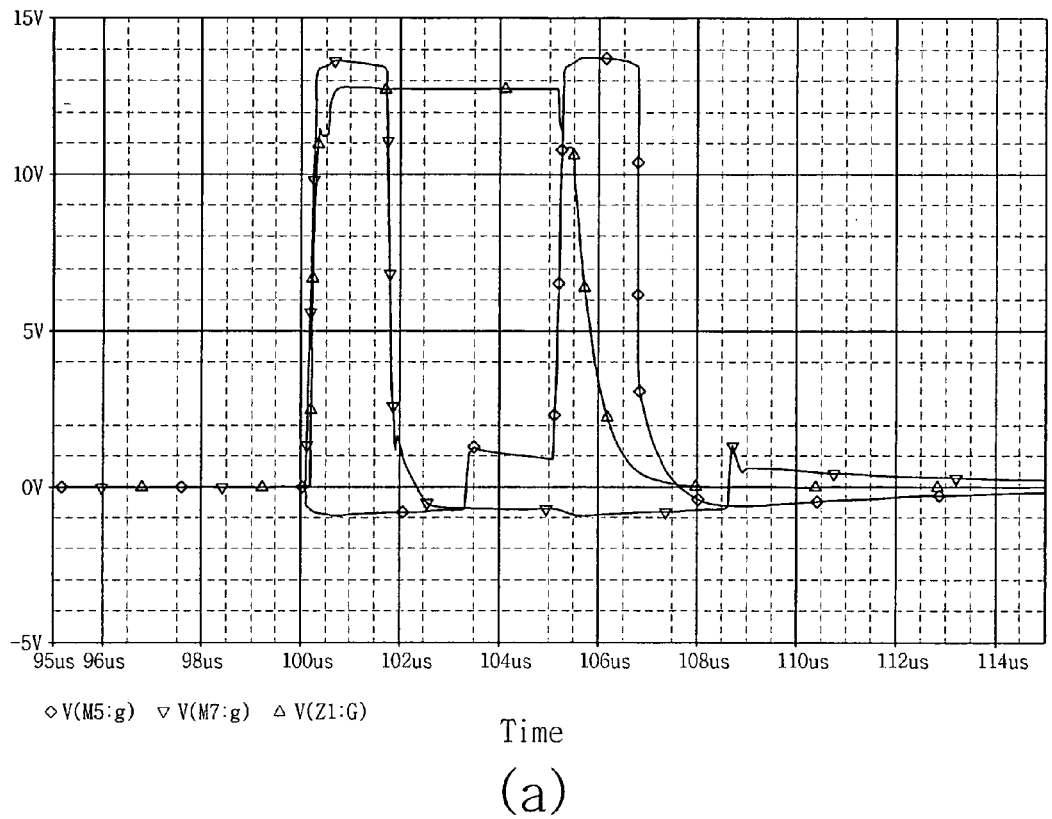
FIG. 10 is a waveform diagram illustrating a simulation result (a) and an experimental result (b) of a control pulse and a gate signal of a semiconductor switch according to the present invention.
Figure 10:
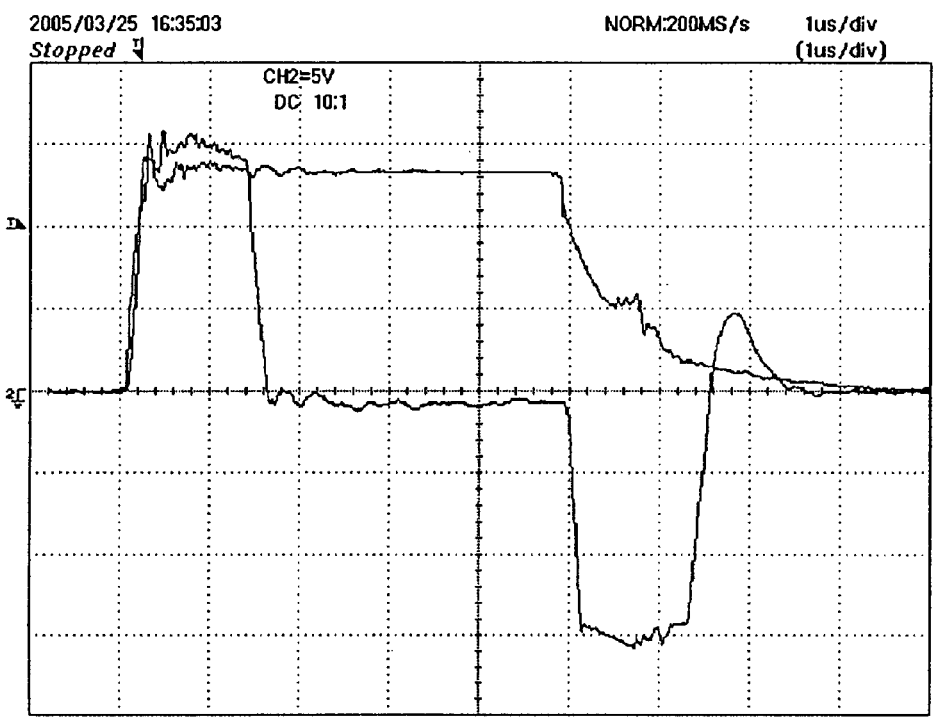

FIG. 10 is a waveform diagram illustrating a simulation result (a) and an experimental result (b) of a control pulse and a gate signal of the semiconductor switch according to the present invention. In FIG. 10, there is shown the experimental waveforms of the turn-on pulse of a positive polarity and the turn-off pulse of a negative polarity applied to the power switch driver via the control transformer, and the gate pulse of the semiconductor switch generated therefrom. As shown in FIG. 10, the current pulse of a positive polarity is symmetrical to allow the same energy to be supplied to the power switch driver 116. The control of the application time between the turn-on pulse and the turn-off pulse enables free adjustment of the pulse width.

Figure 11:
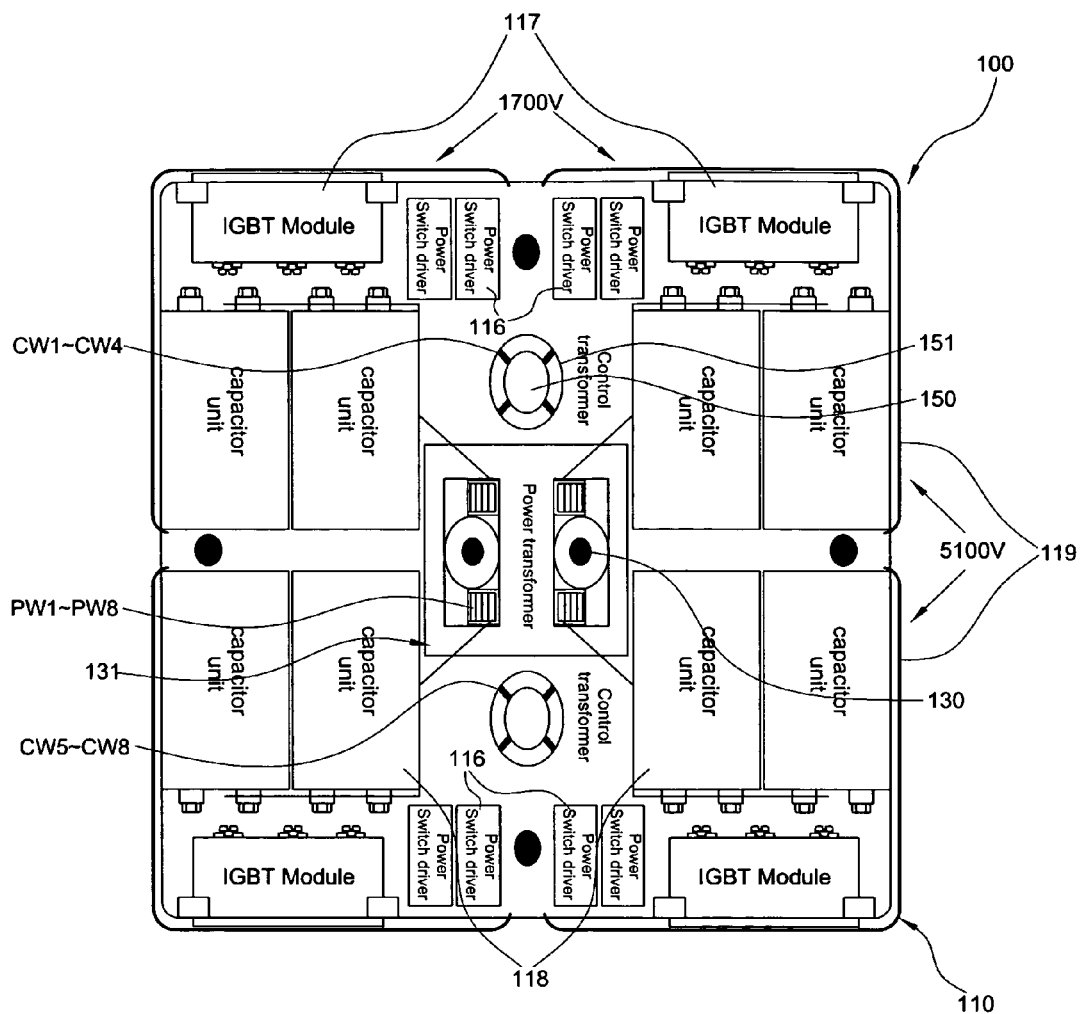
FIG. 11 is a top plan view illustrating the arrangement structure of constituent elements within each power stage in a pulse power generator according to the present invention.
Figure 12:
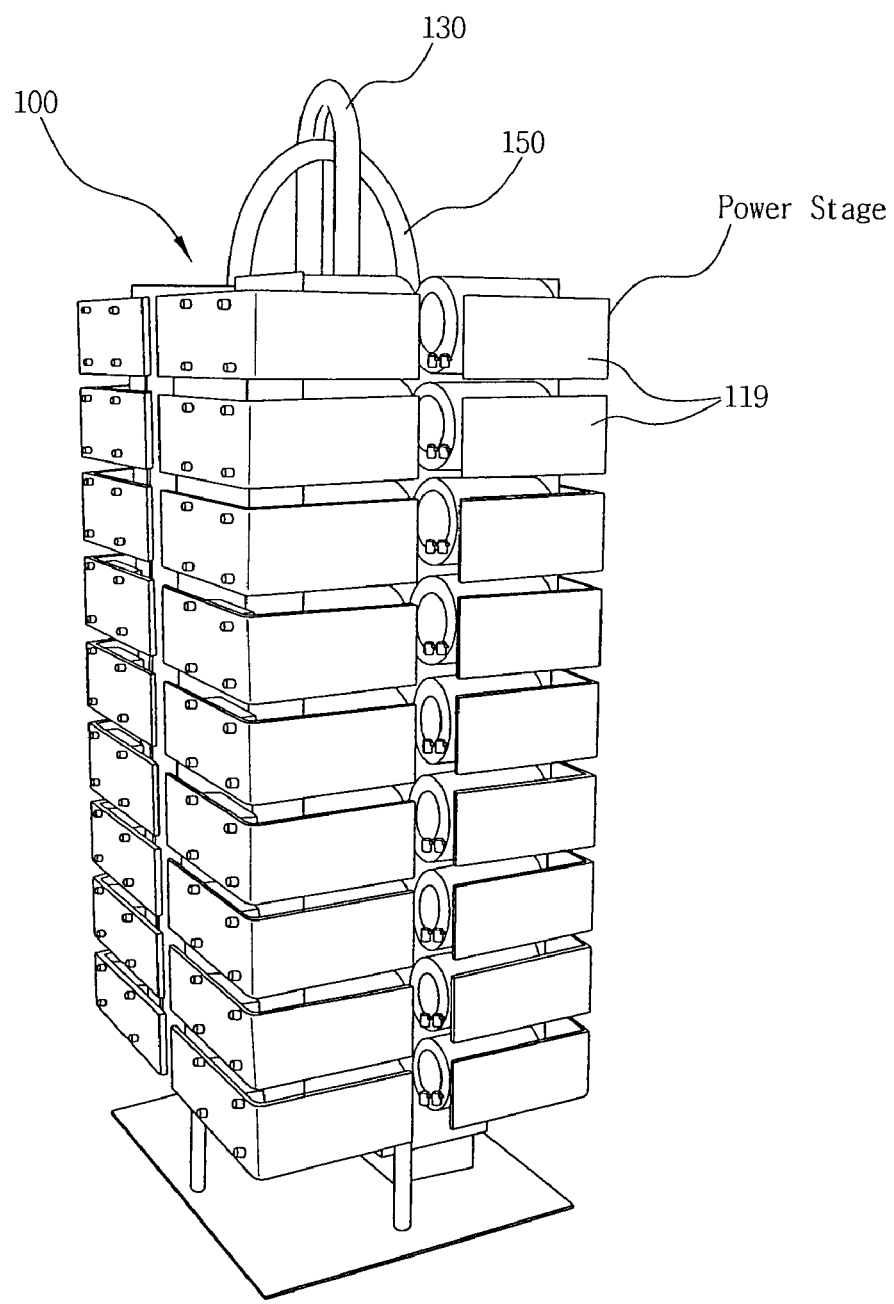
FIG. 12 is a photo showing a pulse power generator in which power stages having the planar arrangement structure shown in FIG. 11 are stacked in multiple layers.

In the meantime, FIG. 11 is a top plan view illustrating the arrangement structure of constituent elements within each power stage in a pulse power generator according to the present invention, and FIG. 12 is a photo showing a pulse power generator in which power stages having the planar arrangement structure shown in FIG. 11 are stacked in multiple layers.

The pulse power generator 100 according to the present invention adopts a stacking structure and arrangement which can minimize the entire size of the generator while minimizing the interference between the power loop 130 and the control loop 150.

First, as shown in FIGS. 11 and 12, the power loop 130 and the control loop 150 are arranged to cross each other at 90 degrees at the upper central portion of the generator so as to solve a problem associated with generation of noises. If the power loop 130 and the control loop 150 are arranged in parallel with each other, when power is supplied to the power loop 130, induced current is generated from the control loop 150 so that the semiconductor switches 112 may be unintentionally triggered although the semiconductor switches 112 in the generator do not have a gate signal. Therefore, the power loop 130 and the control loop 15 is required to be arranged to cross each other at 90 degrees so as to minimize generation of noises therebetween and solve problems associated with a magnetic flux.

Further, as shown in FIG. 12, the power loop 130 and the control loop 150 are disposed such that they are bent in a "U" shape at an upper side of the pulse power generator, more specifically, at an upper side of the power stage 110 positioned at the top end portion of the generator, and then two opposite portions arranged in parallel with each other below the "U"-bent portion are inserted into the generator vertically. At this time, the control loop 150 is mounted in such a fashion that the distance between two opposite portions thereof arranged in parallel with each other is relatively large as compared to the distance between two opposite portions of the power loop 130 arranged in parallel with each other.

In addition, in the present invention, in order to minimize the entire size of the pulse power generator 100, the arrangement state of the constituent elements of the power stage is optimized at each power stage 110. the present inventor has manufactured a pulse power generator with a dimension of 1.1 m×0.6 m×0.5 m having the construction of FIG. 3 in case of an actual pulse voltage of 60 kV (see FIG. 12). First, a plurality of power stages 110 connected in series with one another are arranged to be stacked vertically in a multi-layered structure. Referring to FIG. 12, nine power stages 110 are arranged stacked vertically in such a fashion as to be connected in series with one another. At this time, the nine power stages 110 are of an identical construction to one another.

And, in the present invention, in order to minimize the size of the pulse power generator and to effectively address a problem associated with generation of heat from the semiconductor switch 112, constituent elements thereof are disposed at a square planar space in each power stage 110 in such a fashion as that the planar arrangement structure of the constituent elements is optimized as shown in FIG. 11. In FIG. 11, first, a plurality of semiconductor switch (IGBT) modules 117 (The IGBT module is composed of two semiconductor switches (IGBTs), namely, in case of eight power cells, four IGBT modules each accommodating two semiconductor switches 112 (shown in FIG. 3) are mounted) each accommodating a same number of semiconductor switches (IGBTs) included in the power cells 111 (shown in FIG. 3) are dispersedly disposed at each power stage 110 in such a fashion as to be spaced apart from predetermined intervals at front and rear sides (upper and lower sides of the drawing) and at left and right sides (left and right sides of the drawing) of each power stage so as to be positioned at edges adjacent to four corners of each power stage. That is, four semiconductor switch (IGBT) modules 117 are dispersedly disposed at the front, rear, left and right sides of each power stage. Also, at each power stage 110, a plurality of capacitor units 118 each accommodating the charge capacitor 113 (shown in FIG. 3) and the rectifying diode 115 (shown in FIG. 3) of the power cell are disposed at edges of each power stage in spaces between the front and rear side semiconductor switch modules 117. Four capacitor units 118 are disposed at left and right sides of the drawing, respectively (in case where each power stage consists of eight power cells).

Moreover, a power transformer 131 and a control transformer 151 which the windings of the power loop 130 and the control loop 150 constitute, respectively, are disposed at the central portion of the planar square space of each power stage. At this time, one power transformer 131 provided at each power stage 110 is disposed at the center of the planar square space of each power stage, and is composed of the power loop 130 and windings PW1 to PW8 connected to the rectifying diode 115 of the capacitor unit 118. Also, two control transformers 151 provided at each power stage 110 are disposed at both opposite sides of the power transformer 131, and each control transformer is composed of the control loop 150 and windings CW1 to CW8 connected to the power switch drivers 131. In this manner, one power transformer 131 is disposed at the center of the planar square space of each power stage, and two control transformers 151 are disposed at both opposite sides of the power transformer 131 so as to be spaced apart from each other.

Further, four power switch drivers 116 are disposed to face each other in spaces between the semiconductor switch modules 117 at the upper and lower sides of the drawing, respectively. In case where the capacitor units 118 are dispersedly disposed at left and right sides of the drawing in the same number, it is preferred that the power switch drivers 116 are divisionally and dispersedly at upper and lower sides of the drawing in the same number.

For example, a plurality of power switch drivers 116 each including a power switch driver at each power stage 110 are disposed at the outside of the power transformer 131 and the control transformers 151 in spaces between the semiconductor switch modules 117 disposed at left and right sides (left and right sides of drawing) of the planar square space of each power stage. The plurality of capacitor units 118 each accommodating the capacitor and the rectifying diode of the power cell are disposed at the outside of the power transformer 131 and the control transformers 151 in spaces between the semiconductor switch modules 117 disposed at front and rear sided of the planar square space of each power stage.

Furthermore, in order to solve a problem associated with heat radiation of the semiconductor switch 112 as a heating element, a heat sink 119 is mounted along the circumferential edge of the power stage in such a fashion as to come into contact with the outer surface of the semiconductor switch modules 117. This heat sink 119 basically serves to radiate heat generated from the semiconductor switch modules 117 to the outside. Preferably, the heat sink 119 is disposed along the circumferential edge of each power stage 110 so as to serves as a shield plate and a casing besides the heat radiating element.

In a preferred embodiment of the present invention, the heat sink 119 is formed in a "L" shape and is securely mounted to the outer circumferential edge of each power stage 110 so as to come into contact with the semiconductor switch modules 117. Four heat sinks 119 are fixedly disposed horizontally on the outer circumferential edge of each power stage 110 in such a fashion as to cover the entire portions of the outer circumferential edge of each power stage including four corners of each power stage to act as the shield and the casing. The heat sink 119 is preferably made of an aluminum material having an excellent heat radiating property.

Next, the pulse power generator 100 of the present invention includes a plurality of charge capacitors 113 (refer to FIGS. 3 and 13) connected in series with one another. There has been a problem in that there is a great difference in voltage charged being by the charge capacitors 113 despite application of power for the same time in the process where power is applied to the power switch driver from the power inverter 120 via the power loop 130 to charge the charge capacitors 113 while allowing current to flow through the charge capacitor 113 within each power cell 111. For example, in case where the charge capacitor 113 is charged up to a voltage level of 850V, the charge voltage varies greatly depending on the charge capacitors 113 within a voltage level ranging from 750V to 900V. Particularly, in case where there is a great difference in the charge voltage of the capacitors 113 between the power stages 110, a more serious problem may occur. A difference in the charge voltage between the capacitors 113 is mainly caused by a leakage inductance generated from the power stages 110 during the flow of current along the power loop 130.

Figure 13:
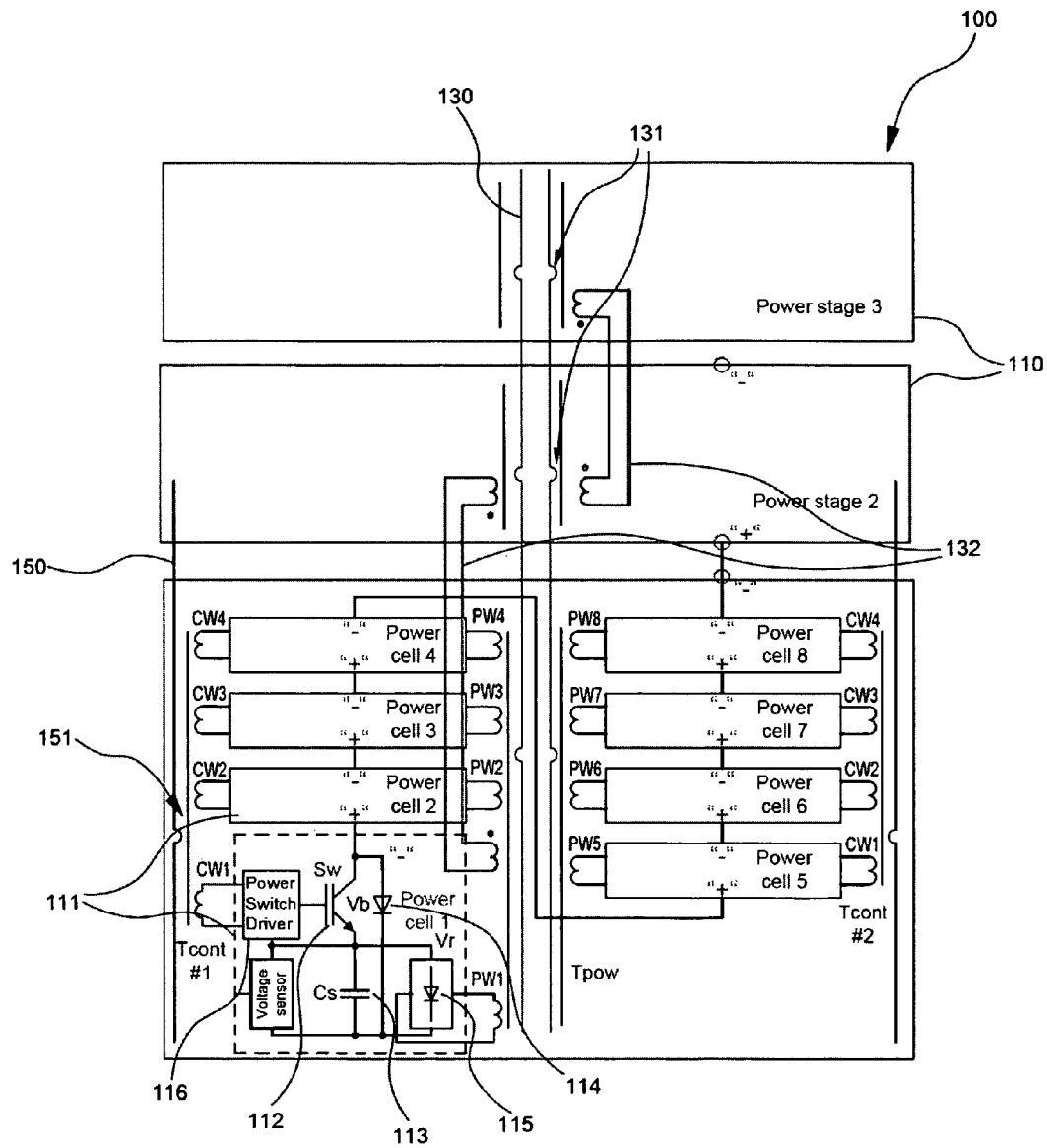
FIG. 13 is a circuit diagram illustrating a pulse power generator including a compensation winding installed therein according to the present invention.

In an attempt to address and solve this problem and compensate for the difference in the charge voltage, referring to FIG. 13, the present invention allows compensation windings 132 connected between the power transformers 131 of the power stages 110 disposed at upper and lower sides of the drawing to be insertedly mounted into the power stages to have a subtractive polarity. That is, the compensation windings 132 are wound between the power transformers 131 disposed at upper and lower sides of the power stages 110 so as to have a mutual subtractive polarity.

Specifically, FIG. 13 is a circuit diagram illustrating a pulse power generator including a compensation winding installed therein according to the present invention.

As shown in FIG. 13, a compensation winding 132 is fit around the power transformer 131 which each power loop 130 constitutes in the form of a winding having a subtractive polarity. At this time, the compensation winding 132 allows a magnetic flux generated between the upper and lower transformers 131 to be automatically adjusted even without a separate control circuit so that the magnetic flux can be maintained in an equilibrium state without any separate compensation control.

In case where the compensation winding 132 is mounted, current flows to a smaller magnetic flux from a larger magnetic flux to cause the magnetic flux to be maintained in an equilibrium state. In this manner, such a magnetic flux-compensating technique can simply solve the problem such as a difference in the charge voltage between the charge capacitors 113 due to a leakage inductance generated from the power transformer.

The present inventor of the present invention has found that if the compensation winding 132 is installed in each power transformer 131 with the number of winding turns being 3, a non-equilibrium rate of DC voltage can be maintained at 5%. If the compensation winding 132 is not used, voltage sensors within the power cells 111 of each power stage 110 calculate non-uniform voltage values to cause the non-equilibrium rate of DC voltage to increase up to 20 to 30%.

Resultantly, the pulse power generator 100 of the present invention enables installation of the compensation winding 132 to automatically adjust the charge voltage of the plurality of charge capacitors 113 uniformly.

Now, a test result obtained by using a resistor load and applying it to Plasma Source Ion Implantation (PSII) in the pulse power generator using the semiconductor switch according to the present invention will be discussed hereinafter.

Figure 14:
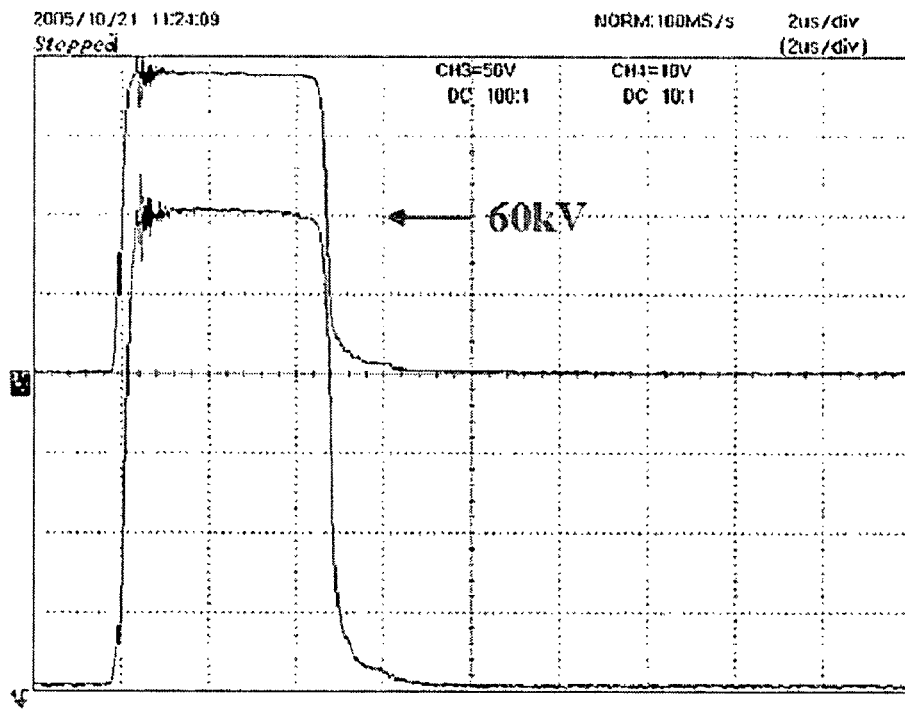
FIG. 14 is a waveform diagram illustrating an application test of 60 kV by a resistor load.

FIG. 14 is a waveform diagram illustrating an application test of 60 kV by a resistor load. It can be seen from FIG. 14 that since a circuit such as a transformer for generating a high-voltage pulse is not used, the pulse power generator has a small inductance to exhibit a very rapid pulse rise time of approximately 300 ns.

Figure 15:
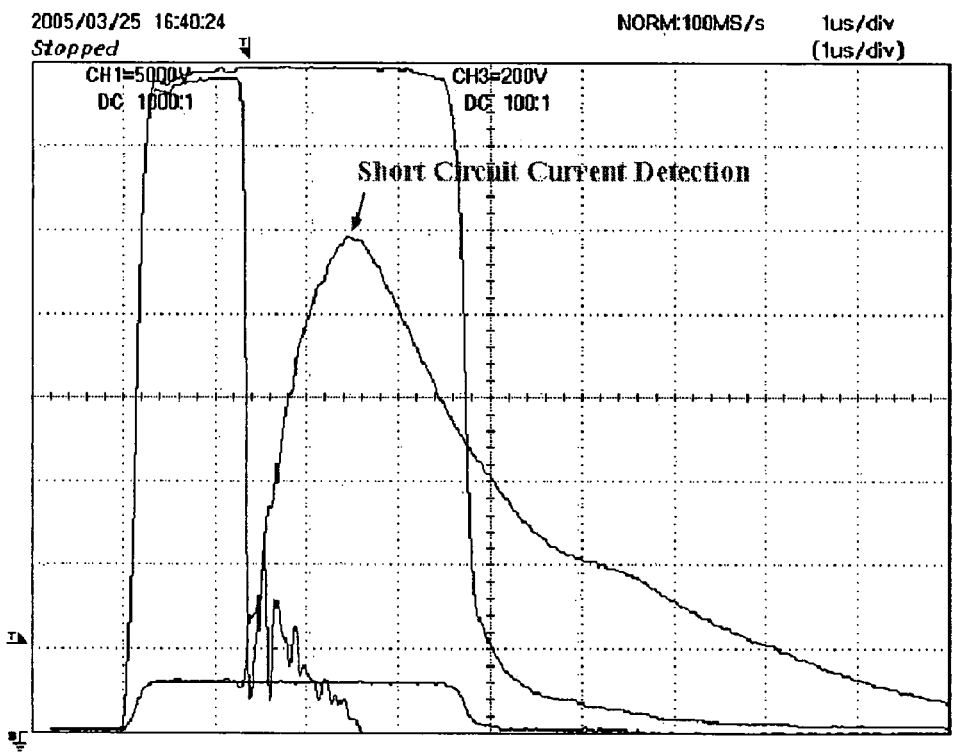
FIG. 15 is a waveform diagram illustrating waveforms of an output voltage and an output current during the protection operation of the pulse power generator when an arc occurs and waveforms of an output voltage and an output current during the general normal operation of the pulse power generator according to the present invention.

FIG. 15 is a waveform diagram illustrating waveforms of an output voltage and an output current during the protection operation of the pulse power generator when an arc occurs and waveforms of an output voltage and an output current during the general normal operation of the pulse power generator according to the present invention. It can be seen from FIG. 15 that the pulse power generator using the semiconductor switch shows an excellent protective operation property upon generation of an arc.

Figure 16:
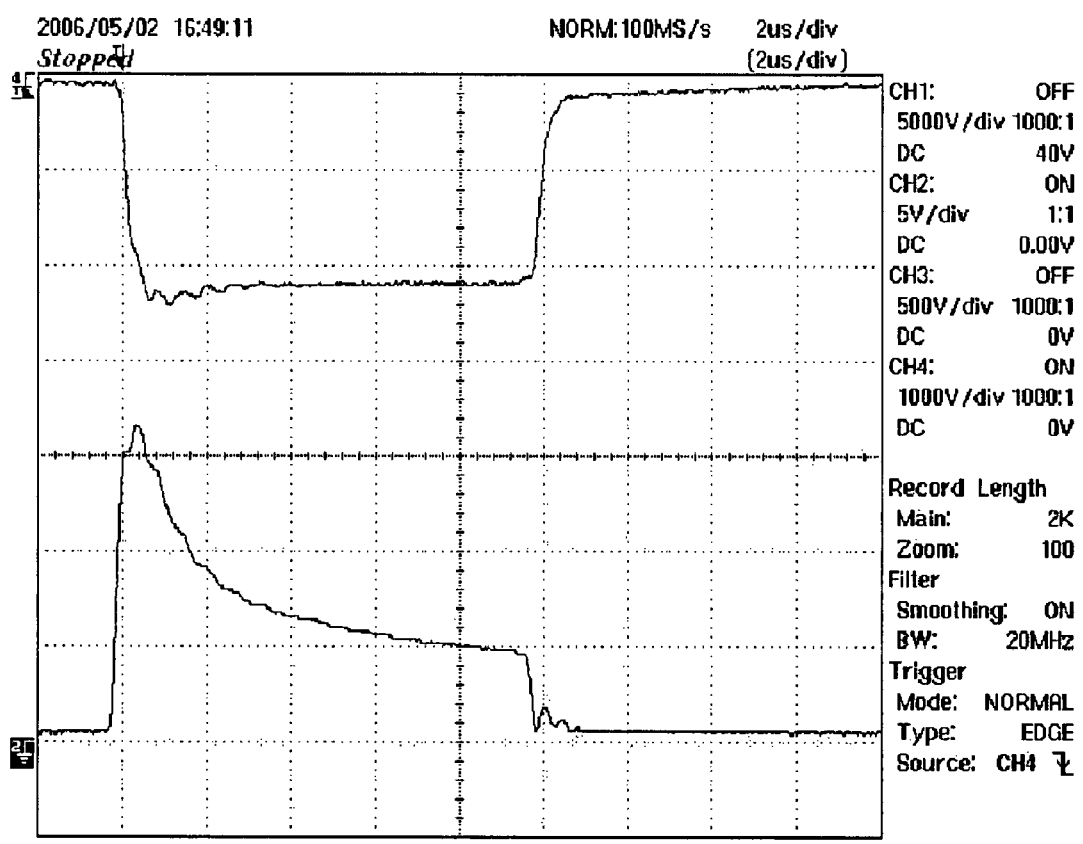
FIG. 16 is a waveform diagram illustrating experimental waveforms under a plasma generating condition according to the present invention.

FIG. 16 is a waveform diagram illustrating experimental waveforms under a plasma generating condition according to the present invention. It can be seen from FIG. 16 that the pulse power generator using the semiconductor switch can be effectively used in a plasma load having a non-linear characteristic.

As described above, the pulse power generator using the semiconductor switch according to the present invention has the following advantageous effects:

First, in place of the spark gap switch having a limitation in lifespan due to abrasion caused by occurrence of an arc, semiconductor switches having a permanent lifespan are connected in series with one another, and problem associated with damage of the devices can be overcome even if synchronization is not performed upon the driving of the semiconductor switches, thereby improve the entire lifespan of the generator and its elements, enable its miniaturization and make it possible to diversely control a high-voltage pulse output finally.

Second, it is possible to provide a power switch driver which is relatively simple in structure and high in reliability as compared to the conventional power generator while concurrently supplying a gate signal and a gate power.

Third, particularly, it is possible to address and solve a difficulty in driving the semiconductor switch in series, i.e., the problems related to synchronization and insulation of a driving power supply, and it is possible to include a circuit which can cope with the generation of arc and short circuit to thereby significantly improve element protecting performance and stability of the pulse power generator.

Fourth, the power switch driver enables diverse control of a high-voltage pulse that is output finally. Control signals generated from the control inverter, i.e., a turn-on signal and a turn-off signal can be suitably controlled so as to freely adjust a pulse width, and a pulse repetition rate (pulse frequency) can be increased without any restriction. In addition, a rapid rise/fall time of a pulse can be implemented, and various control of rapid response and the rectangular shape of a pulse is possible.

Fifth, owing to a stacking structure and arrangement which minimizes the interference between the power loop and the control loop, the arrangement of the constituent elements is optimized to thereby greatly reduce the entire size of the generator, and to resultantly provide a high-efficiency pulse power generator which can be miniaturized, light-weight and reduced in manufacturing cost.

Sixth, it is possible to adopt an optimal cooling structure which can effectively cope with the heat radiation of a heating element (IGBT) along with the optimization of the arrangement, thereby further ensuring stability of the pulse power generator.

Seventh, it is possible to solve a difference in the charge voltage of the charge capacitors between the power stages without any separate compensation control through a simple method of fitting the compensation winding between the upper and lower power stages.

Eighth, the inventive pulse power generator can be widely utilized in various test equipment and E-beam apparatuses, PSII, sterilization and environment fields, etc.

The invention has been described in detail with reference to preferred embodiments thereof. However, it will be appreciated by those skilled in the art that changes may be made in these embodiments without departing from the principles and spirit of the invention, the scope of which is defined in the appended claims and their equivalents.

What is claimed is:

1. A pulse power generator comprising:
    a plurality of power stages connected in series with one another, each power stage including a plurality of power cells connected in series with one another, wherein each power cell has a semiconductor switch and a charge capacitor, an emitter of the semiconductor switch being connected to the charge capacitor, a power switch driver for driving the semiconductor switch, a bypass diode connected to both ends of the semiconductor switch, and a rectifying diode connected to both ends of the charge capacitor and the semiconductor switches of the plurality of power cells are connected in series with one another;

a power inverter for supplying power so as to charge the charge capacitor;

a power loop for allowing a power to be supplied to the rectifying diodes within the respective power cells of each power stage from the power inverter, the power loop being formed of a high-voltage insulating cable;

a control inverter for supplying a control signal so as to generate a gate signal and a gate power of the semiconductor switch; and a control loop for allowing the control signal to be supplied to the power switch drivers within the respective power cells of each power stage from the control inverter, the control loop being formed of a high-voltage insulating cable, whereby the plurality of power stages are connected in series with one another so that the entire semiconductor switches are connected in series with one another.

2. The pulse power generator according to claim 1, wherein the semiconductor switch is an insulated gate bipolar transistor (IGBT) or metal-oxide semiconductor field effect transistor (MOSFET).

3. The pulse power generator according to claim 1, wherein the power switch driver is configured such that it is connected to a gate, a collector and an emitter of the semiconductor switch and receives the control signal supplied from the control inverter through the control loop so as to concurrently output a gate signal and a driving power for driving the semiconductor switch 112 in response to the received control signal.

4. The pulse power generator according to claim 3, wherein the power switch driver includes:

a capacitor adapted to be charged in response to the control signal of the control inverter applied through the control loop to supply the charged power as a driving power to the collector of the semiconductor switch;

a switching transistor connected to a gate of the semiconductor switch to be turned on in response to the control signal of the control inverter applied through the control loop so as to apply the gate signal to the semiconductor switch to turn on the semiconductor switch; and a plurality of diodes, switching devices, and resistors, which are disposed between the capacitor and the switching device, and between the switching device and connection terminals connected to the gate, the collector and the emitter of the semiconductor switch, so that the switching device is turned on in response to the control signal and simultaneously power charged in the capacitor is applied to the collector of the semiconductor switch, and the switching device being turned on is turned off in response to the control signal to turn off the semiconductor switch or when a short circuit occurs at both ends of the semiconductor switch, the switching device is turned off to turn off the semiconductor switch.

5. The pulse power generator according to claim 1, wherein the power inverter functions to convert AC voltage applied thereto from an AC power supply into DC voltage so as to supply power for charging the capacitors to the power cells of each power stage, and includes four switching devices four diodes which are driven by means of a resonant power inverter controller via a full bridge inverter connected to the AC power supply, a resonant capacitor, a resonant inductor, the resonant power inverter controller, drivers.

6. The pulse power generator according to claim 1 or 4, wherein the control inverter functions to convert AC voltage applied thereto from the AC power supply into DC voltage so as to generate a control signal to be applied to each power switch driver, and includes four switching devices and four diodes which are driven by means of a timing controller via a full bridge inverter connected to the AC power supply, the timing controller and drivers for generating the control signal.

7. The pulse power generator according to claim 6, wherein the control inverter generates the control signal in which a turn-on signal having a positive (+) polarity and a turn-off signal having a negative (−) polarity are repeatedly output as the control signal to be applied to each power switch driver.

8. The pulse power generator according to claim 7, wherein the control inverter generates the control signal in which a several turn-off signals for pre-charging the capacitors included in the power switch driver, a turn-on signal for turning on a switching device connected to the semiconductor switch in the power switch driver, and a turn-off signal for turning off the switching device are repeatedly output.

9. The pulse power generator according to claim 7, wherein the control inverter is configured to control the output of the turn-on signal and the turn-off signal under the control of the timing controller.

10. The pulse power generator according to claim 4, wherein the power switch driver is configured such that when it receives the turn-on signal from the control inverter, the switching device connected to the gate of the semiconductor switch is turned on, and when it receives the turn-off signal from the control inverter, the switching device is turned off, so that the switching device continues to be maintained in a turned-on state until the turn-off signal is applied to the power switch driver after application of the turn-on signal to the power switch driver.

11. The pulse power generator according to claim 10, wherein the power switch driver includes a diode installed between the switching device and a connection terminal connected to a collector of the semiconductor switch, so that the switching device and the semiconductor switch continue to be maintained in a turned-on state until the turn-off signal is applied to the power switch driver, and if a short current flows through the semiconductor switch, the diode is reverse-biased to thereby turn off the switching device and the semiconductor switch due to an increase in a voltage drop across the semiconductor switch.

12. The pulse power generator according to claim 1, wherein the plurality of power stages connected in series with one another are arranged to be stacked vertically in a multi-layered structure, wherein a plurality of semiconductor switch modules each accommodating a same number of semiconductor switches included in the power cells, the power switch drivers included in the power cells, a plurality of storage capacitor units each accommodating the capacitor and the rectifying diode of the power cell are dispersedly disposed in a planar square space of each power stage in such a fashion that the plurality of semiconductor switch modules are spaced apart from predetermined intervals the front, rear, left and right sides in the planar square space so as to be positioned at edges adjacent to four corners of each power stage, and wherein a power transformer and a control transformer, which the power loop and the control loop constitute, respectively, are disposed at the central portion of the planar square space.

13. The pulse power generator according to claim 12, wherein the power loop constitutes the power transformer in each power stage together with windings connected to the rectifying diodes within the plurality of power cells constituting each power stage, and power supplied to each power stage from the power inverter via the power transformer allows the charge capacitors within the power cells of each power stage to be charged in parallel.

14. The pulse power generator according to claim 13, wherein the power loop constitutes the power transformer in each power stage in conjunction with windings connected to the rectifying diodes within the plurality of power cells constituting each power stage.

15. The pulse power generator according to claim 12, wherein the control loop constitutes the control transformer in each power stage together with windings connected to the power switch drivers within the plurality of power cells constituting each power stage, and the power switch drivers are applied with the control signal supplied to each power stage from the control inverter via the control transformer as insulated gate power applied to the power cells via each power stage.

16. The pulse power generator according to claim 15, wherein the control loop constitutes the control transformer in each power stage in conjunction with windings connected to the power switch drivers within the plurality of power cells constituting each power stage.

17. The pulse power generator according to claim 16, wherein the control transformer is configured such that the control loop of one turn formed of a high-voltage insulating cable passes through the center of a core of the control transformer on which the windings of the power switch drivers within the plurality of power cells are wound.

18. The pulse power generator according to claim 12, wherein the plurality of power switch drivers are placed between the semiconductor switch modules positioned at left and right sides of the planar square space defined by each power stage; and are placed outside the power transformer and the control transformer.

19. The pulse power generator according to claim 12, wherein the plurality of capacitor units are placed between the semiconductor switch modules positioned at front and rear sides of the planar square space defined by each power stage; and are placed outside the power transformer and the control transformer.

20. The pulse power generator according to any one of claim 12, 18 and 19, wherein the power loop and the control loop are bent in a "U" shape at an upper side of the power stage positioned at a top end portion of the generator, and constitute the power transformer and the control transformer, respectively, together with the windings connected to the rectifying diodes of the capacitor units and the windings connected to the power switch drivers while two opposite portions arranged in parallel with each other below the "U" shaped portion pass through the plurality of power stages arranged to be stacked vertically in order.

21. The pulse power generator according to claim 20, wherein the power loop and the control loop are arranged to cross each other at 90 degrees so as to solve problems associated with generation of noises between the power loop and the control loop and a magnetic flux.

22. The pulse power generator according to claim 20, wherein the control loop is mounted in such a fashion that the distance between two opposite portions thereof arranged in parallel with each other is relatively large as compared to the distance between two opposite portions of the power loop arranged in parallel with each other, and wherein the power transformer that the two parallel opposite portions of the power loop constitute is disposed at the center of the planar square space of each power stage, and the control transformers that the two parallel opposite portions of the control loop constitute are disposed at both opposite sides of the power transformer.

23. The pulse power generator according to claim 12, wherein a heat sink is securely mounted on the outer circumferential edge of each power stage in such a fashion as to come into contact with the outer surfaces of the semiconductor switch modules.

24. The pulse power generator according to claim 23, wherein the heat sink is formed in a "L" shape and four heat sinks are fixedly disposed horizontally on the outer circumferential edge of each power stage in such a fashion as to cover the entire portions of the outer circumferential edge of each power stage including four corners of each power stage to act as a shield plate and a casing.

25. The pulse power generator according to claim 23 or 24, wherein the heat sink is made of an aluminum material having an excellent heat radiating property.

26. The pulse power generator according to claim 12, wherein compensation windings having a subtractive polarity are connected between the power transformers of the upper and lower power stages that the power loop constitutes in the plurality of power stages stacked vertically.

* * * * *